United States Patent
Cho et al.

(10) Patent No.: US 7,973,993 B2
(45) Date of Patent: Jul. 5, 2011

(54) FLAT PANEL DISPLAY AND MANUFACTURING METHOD THEREOF

(75) Inventors: Don-Chan Cho, Seongnam-si (KR); Jae-Byung Park, Seongnam-si (KR); Jong-Hyuk Kang, Suwon-si (KR); Sung-Jin Hong, Seoul (KR); Yu-Kwan Kim, Incheon (KR); Seul Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/534,364

(22) Filed: Aug. 3, 2009

(65) Prior Publication Data

US 2010/0123947 A1    May 20, 2010

(30) Foreign Application Priority Data

Nov. 20, 2008  (KR) .................. 10-2008-0115690

(51) Int. Cl.
*G02B 26/02* (2006.01)
*G02B 26/00* (2006.01)

(52) U.S. Cl. ........................ 359/233; 359/290

(58) Field of Classification Search ............... 359/198.1, 359/221.2, 224.1, 233, 290
See application file for complete search history.

(56) References Cited

U.S. PATENT DOCUMENTS

| | | | |
|---|---|---|---|
| 6,201,633 B1 | 3/2001 | Peeters et al. | |
| 6,775,048 B1 | 8/2004 | Starkweather et al. | |
| 6,882,461 B1 | 4/2005 | Tsai et al. | |
| 7,405,852 B2* | 7/2008 | Brosnihan et al. | 359/198.1 |
| 2006/0067650 A1 | 3/2006 | Chui | |

FOREIGN PATENT DOCUMENTS

| | | |
|---|---|---|
| JP | 2008151823 | 7/2008 |
| KR | 1020020010322 A | 2/2002 |
| KR | 100368637 B | 1/2003 |
| KR | 100703313 B | 3/2007 |
| KR | 100763397 B1 | 9/2007 |
| KR | 1020070108969 A | 11/2007 |
| KR | 1020070114162 A | 11/2007 |

* cited by examiner

Primary Examiner — William C Choi
(74) Attorney, Agent, or Firm — F. Chau & Associates, LLC (57) ABSTRACT

A flat panel display includes a first substrate, a thin film transistor formed on the first substrate, a second substrate facing the first substrate, and a light controller formed on the second substrate, wherein the light controller is electrically connected to the thin film transistor, wherein the light controller includes an opening plate having a plurality of first openings and a light blocker moving horizontally with respect to the opening plate to selectively pass light through the first openings.

20 Claims, 7 Drawing Sheets

FLAT PANEL DISPLAY AND MANUFACTURING METHOD THEREOF

CROSS-REFERENCE TO RELATED APPLICATION

This application claims priority to Korean Patent Application No. 10-2008-0115690 filed on Nov. 20, 2008, the entire contents of which are incorporated herein by reference.

BACKGROUND OF THE INVENTION (a) Technical Field

The present disclosure relates to a flat panel display and a manufacturing method thereof, and more particularly to a flat panel display having an electro mechanical light controller and a manufacturing method thereof.

(b) Discussion of the Related Art

As currently popular flat panel displays, there are a liquid crystal display (LCD), a plasma display device (PDP), an organic light emitting device (OLED), a field effect display (FED), and an electrophoretic display device.

Among them, the liquid crystal display is widely used as a monitor and a television, the plasma display device is used as a television of a large size, and the organic electric field emissive display device is used for a window of a mobile phone, but research on applying it to a display device of a medium size and a large size has been actively undertaken. Research on applying the electric field effect display device or the electrophoretic display to a monitor, a television, or electric paper has been undertaken. However, the display devices that are currently known each have their drawbacks. Particularly, the liquid crystal display has drawbacks such as a narrow viewing angle, a slow response speed, and low efficiency. As a flat panel display without these drawbacks, a flat panel display having merits such as high photo-efficiency and a high speed switching characteristic, and based on a micro electromechanical system (MEMS) has been researched.

The above information disclosed in this Background section is only for enhancement of understanding of the background of the invention and therefore it may contain information that does not form the prior art that is already known in this country to a person of ordinary skill in the art.

SUMMARY OF THE INVENTION

According to an exemplary embodiment of the present invention, a flat panel display includes a first substrate, a thin film transistor formed on the first substrate, a second substrate facing the first substrate, and a light controller formed on the second substrate, wherein the light controller is electrically connected to the thin film transistor, wherein the light controller includes an opening plate having a plurality of first openings and a light blocker moving horizontally with respect to the opening plate to selectively pass light through the first openings.

The thin film transistor may include a gate electrode, a source electrode, and a drain electrode, and a protrusion electrode connected to the drain electrode.

The first substrate may further include a protrusion, and the protrusion electrode is formed on the protrusion.

The light blocker can be formed on an inner surface of the second substrate and between the first substrate and the second substrate.

The light blocker may include a light blocking portion having a plurality of second openings and a blocking portion, an electrode providing an electric force to horizontally move the light blocking portion, and a restoring portion providing a restoring force to move the light blocking portion to an original position.

The light blocking portion can be separated from the second substrate by a predetermined interval.

The electrode may include a first supporter formed on the second substrate, a flexible beam connected to the first supporter and curved with a bow shape, and a connection beam separated from the flexible beam by a predetermined interval and connected to the light blocking portion.

The first supporter may contact the protrusion electrode.

An electric signal of the protrusion electrode can be transmitted to the electrode through the first supporter.

The flat panel display may further comprise a second supporter supporting the second connection beam.

The opening plate can be formed on an outer surface of the second substrate.

The first substrate and the light blocking portion can maintain an interval by the height of the protrusion.

A transmittance of light passing through the first openings can be controlled by controlling respective positions of the second openings by the movement of the light blocker.

According to an exemplary embodiment of the present invention, a method for manufacturing a flat panel display comprises forming a thin film transistor on a first substrate, forming a protrusion electrode connected to the thin film transistor, forming an opening plate having a plurality of first openings on a first surface of a second substrate, and forming a light blocker having a first supporter on a second surface of the second substrate.

The method may further comprise combining the first substrate and the second substrate by contacting the protrusion electrode with the first supporter of the light blocker.

The method may further comprise forming the light blocker comprises turning over the second substrate and mounting the second substrate on a stage.

The first surface can be separated from a bottom surface of the stage by a predetermined interval.

The opening plate can be formed by using a printing roller.

The opening plate can be formed by a selection printing through a surface treatment.

Forming the light blocker may include forming a buffer layer having a plurality of holes, forming the light blocker inside the plurality of holes, and removing the buffer layer.

BRIEF DESCRIPTION OF THE DRAWINGS

Exemplary embodiments of the present invention can be understood in more detail from the following descriptions taken in conjunction with the accompanying drawings, in which.

DETAILED DESCRIPTION OF EXEMPLARY EMBODIMENTS

The present invention will be described more fully hereinafter with reference to the accompanying drawings, in which exemplary embodiments of the invention are shown. This invention may, however, be embodied in many different forms and should not be construed as limited to the exemplary embodiments set forth herein.

It will be understood that when an element such as a layer, film, region, or substrate is referred to as being "on" another element, it can be directly on the other element or intervening elements may also be present.

Figure 1:
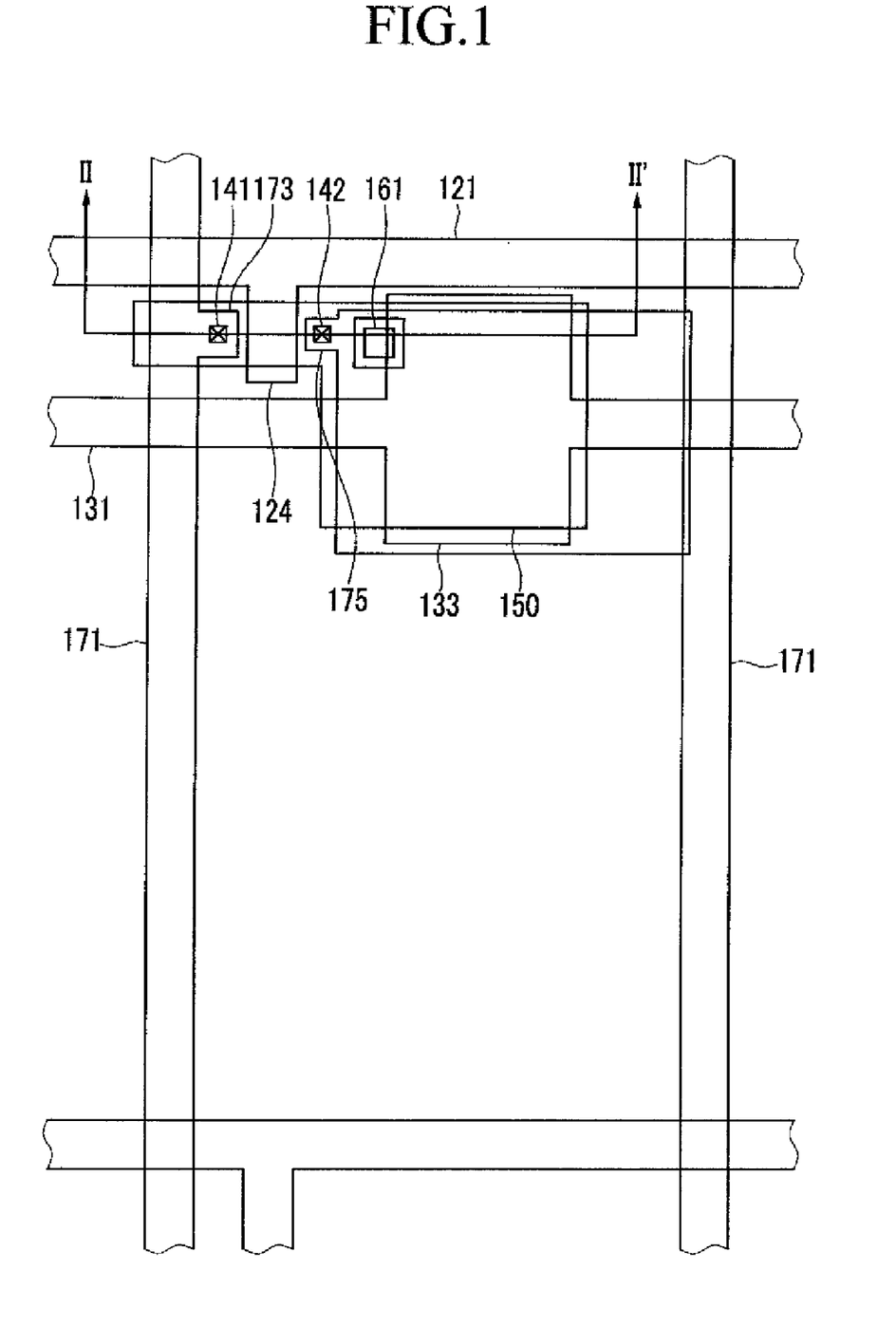
FIG. 1 is a layout view of a first substrate of a flat panel display according to an exemplary embodiment of the present invention.
Figure 2:
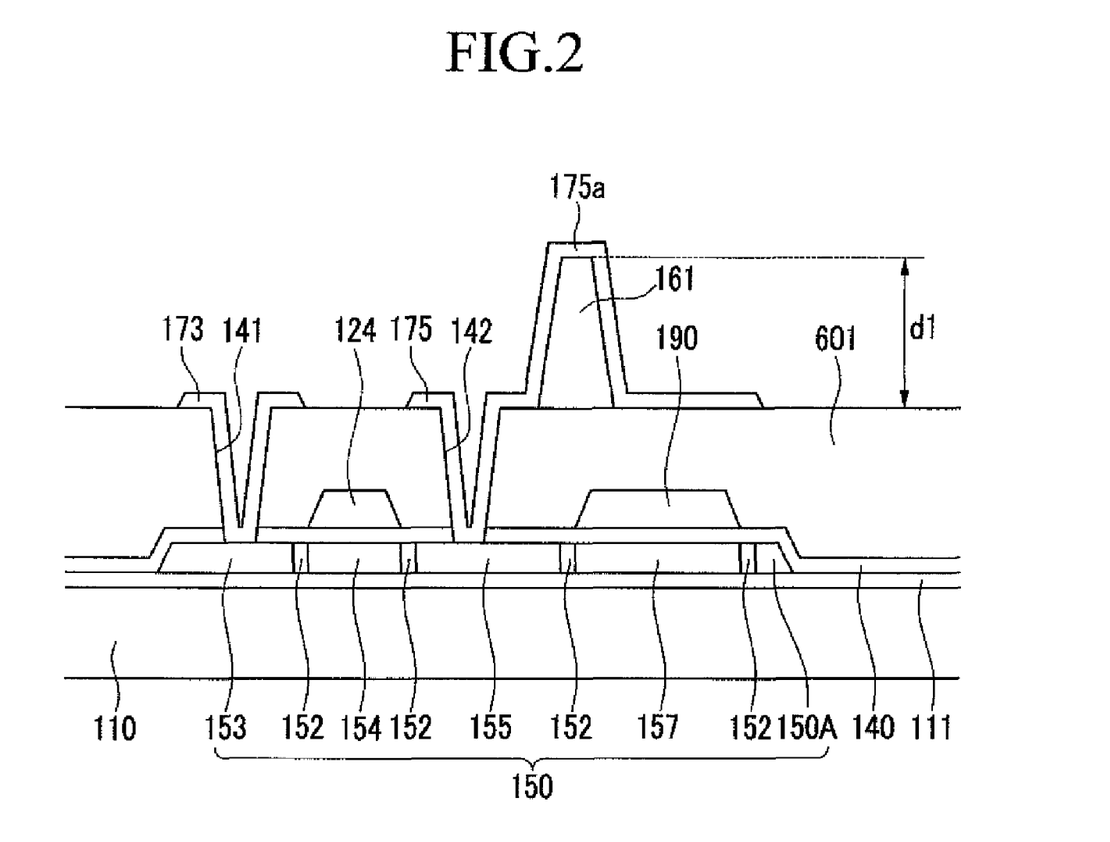
FIG. 2 is a cross-sectional view of the first substrate taken along the line II-II' of FIG. 1 according to an exemplary embodiment of the present invention.

FIG. 1 is a layout view of a first substrate of a flat panel display according to an exemplary embodiment of the present invention. FIG. 2 is a cross-sectional view of the first substrate taken along the line II-II' of FIG. 1 according to an exemplary embodiment of the present invention.

Referring to FIG. 1 and FIG. 2, a blocking layer 111 comprising silicon oxide (SiOx) or silicon nitride (SiNx) is formed on a first transparent insulation substrate 110. The blocking layer 111 improves cohesion between the insulation substrate 110 and a polysilicon layer 150, and can prevent a conductive impurity existing in the first transparent insulation substrate 110 from being diffused into the polysilicon layer 150.

The polysilicon layer 150 including a source region 153, a drain region 155, a channel region 154, and a lightly doped extrinsic region 152 is formed on the blocking layer 111.

The lightly doped extrinsic region 152 prevents leakage current or punch-through. The source region 153 and the drain region 155 are doped with N-type or P-type conductive impurities with a high concentration, and the channel region 154 is not doped with impurities.

A gate insulating layer 140 is formed on the polysilicon layer 150.

A gate line 121 extending in one direction is formed on the gate insulating layer 140. A portion of the gate line 121 is extended thereby overlapping the channel region 154 of the second polysilicon layer 150. The extended portion of the gate line 121 is used as a gate electrode 124 of a thin film transistor. One end of the gate line 121 may have a wider area than the width of the gate line 121 for a connection with an external circuit.

A storage electrode line 131 for increasing storage capacitance of a pixel is formed parallel to the gate line 121. In an exemplary embodiment, the storage electrode line 131 can comprise a same material as the gate line 121. A portion of the storage electrode line 131 overlapping the polysilicon layer 150 is a storage electrode 133. The polysilicon layer 150 overlapping the storage electrode 133 is a storage electrode region 157.

The gate line 121 and the storage electrode line 131 may include a conductive layer having low resistance such as, for example, aluminum (Al), an aluminum-based metal, aluminum alloys, silver (Ag), a silver-based metal, or silver alloys. The gate line 121 and the storage electrode line 131 may have a multilayered structure including a conductive layer having good electrical and physical contact characteristics with a different material such as, for example, ITO or IZO. The conductive layer of the multilayered structure can be such as, for example, chromium (Cr), titanium (Ti), tantalum (Ta), molybdenum (Mo), or alloys thereof. In an exemplary embodiment, a molybdenum-tungsten (MoW) alloy can be used as the conductive layer of the multilayered structure. An example of a combination of the lower layer and the upper layer in the multilayered structure may be chromium/aluminum-neodymium (Nd) alloy.

An interlayer insulating layer 601 is formed on the gate insulating layer 140 where the gate line 121 and the storage electrode line 131 are formed. The interlayer insulating layer 601 may comprise double layers of $SiO_2$/SiN. When the interlayer insulating layer 601 comprises $SiO_2$/SiN, the reliability of the thin film transistor is improved as compared to when the interlayer insulating layer 601 comprises a single layer of $SiO_2$.

The interlayer insulating layer 601 includes first and second contact holes 141 and 142 respectively exposing the source region 153 and the drain region 155.

A protrusion 161 having a height d1 is formed on the interlayer insulating layer 601. A data line 171 intersecting the gate line 121 is formed on the interlayer insulating layer 601. A portion or a branch of the data line 171 is connected to the source region 153 through the first contact hole 141. The portion connected to the source region 153 is used as a source electrode 173 of the thin film transistor. One end of the data line 171 may be wider than the width of the data line 171 for a connection with an external circuit.

A drain electrode 175 connected to the drain region 155 through the second contact hole 142 is formed with the same layer as the data line 171, and is separated from the source electrode 173 by a predetermined distance. The drain electrode 175 is extended on the protrusion 161, thereby forming a protrusion electrode 175a. The protrusion electrode 175a may be formed through photolithography according to an exemplary embodiment of the present invention.

The data line 171 and the drain electrode 175 may comprise a conductive layer having good electrical and physical contact characteristics with ITO or IZO. The data line 171 and the drain electrode 175 may comprise such as, for example, a molybdenum-based metal or a molybdenum alloy. In an exemplary embodiment, the conductive layer may comprise a molybdenum-tungsten (MoW) alloy. The data line 171 and the drain electrode 175 may include a conductive layer having low resistance such as an aluminum-based metal aluminum alloys, a silver-based metal or silver alloys. The data line 171 and the drain electrode 175 may have a multilayered structure including the conductive layer having low resistance and a different conductive layer comprising chromium (Cr), titanium (Ti), tantalum (Ta), molybdenum (Mo), and alloys thereof. In an exemplary embodiment, the different conductive layer can be a molybdenum-tungsten (MoW) alloy.

In an exemplary embodiment of the present invention, the thin film transistor comprises the polysilicon layer 150. In an exemplary embodiment, the thin film transistor comprises an amorphous silicon layer.

Figure 3:
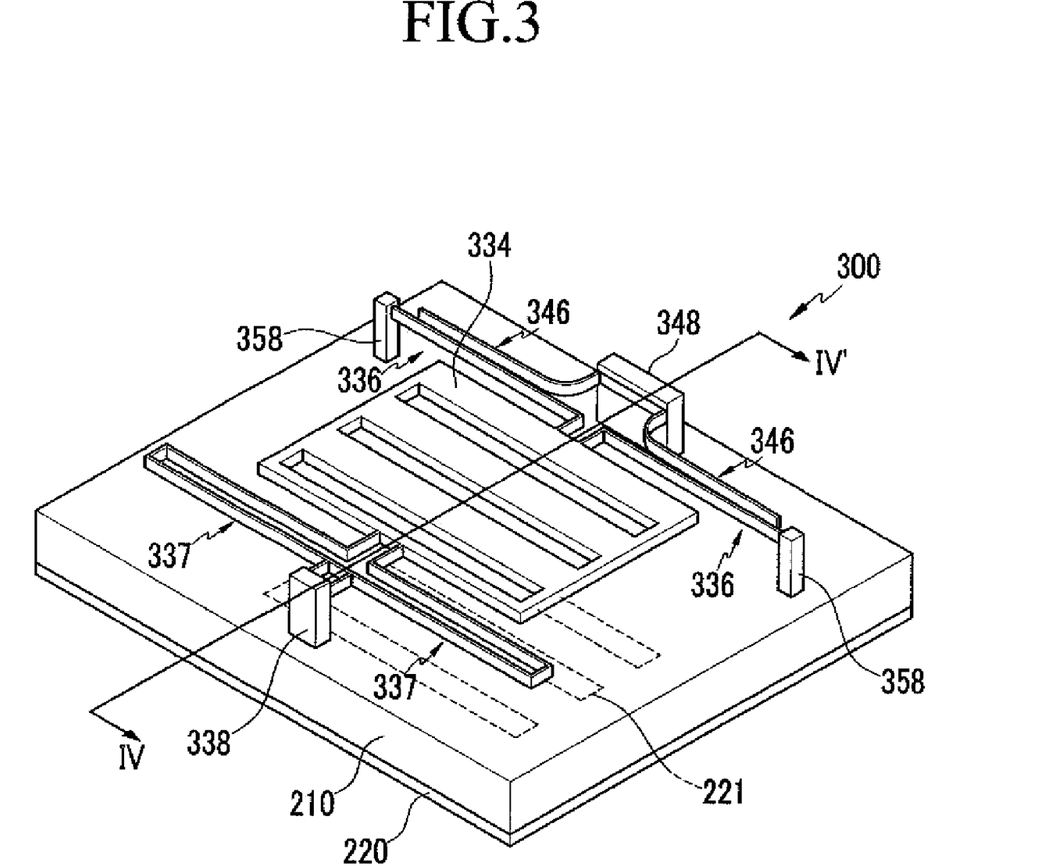
FIG. 3 is a perspective view of a second substrate of a flat panel display according to an exemplary embodiment of the present invention.
Figure 4:
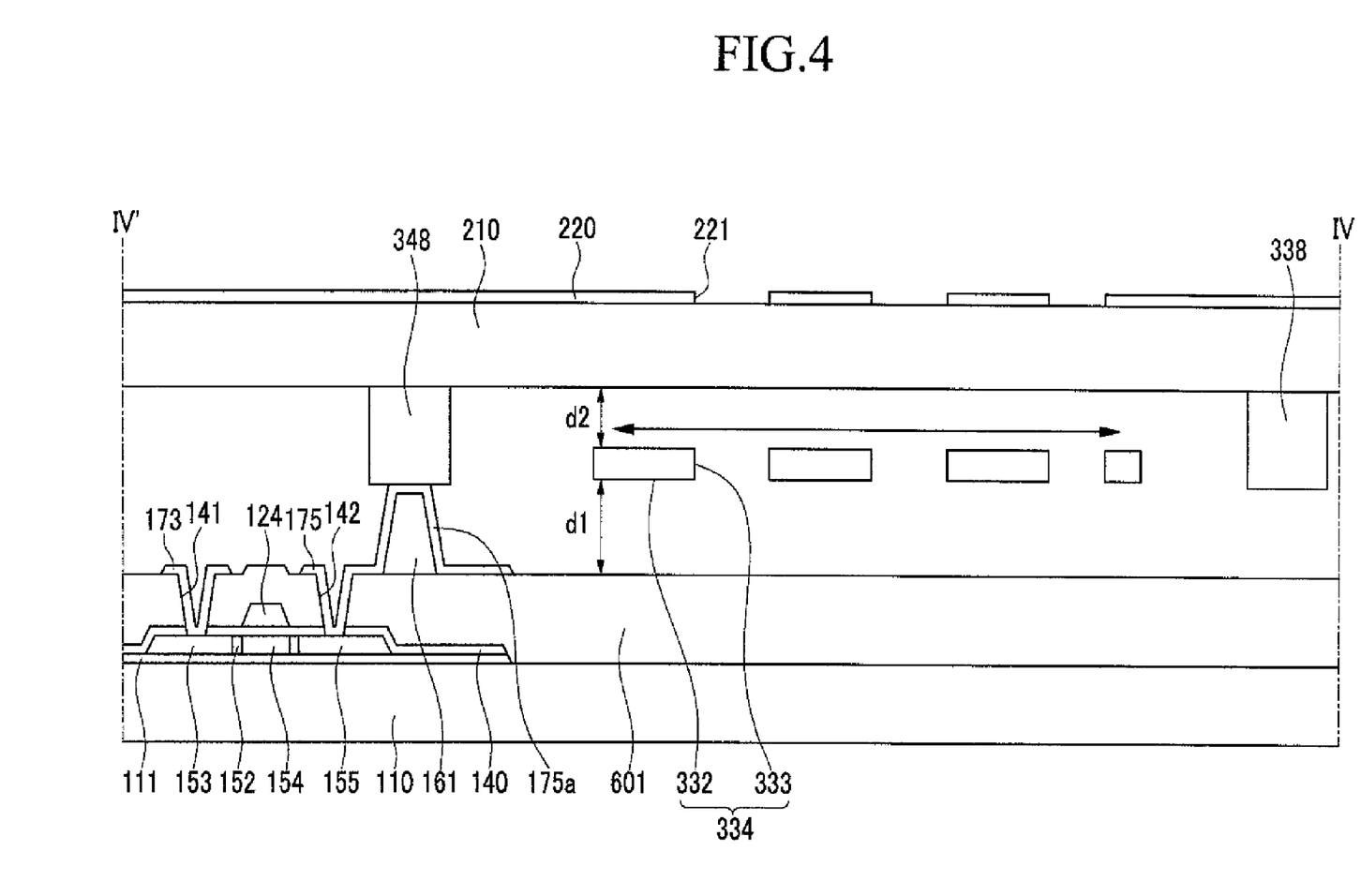
FIG. 4 is a cross-sectional view of the second substrate taken along the line IV-IV' of FIG. 3 and a first substrate disposed thereon according to an exemplary embodiment of the present invention.

FIG. 3 is a perspective view of a second substrate of a flat panel display according to an exemplary embodiment of the present invention. FIG. 4 is a cross-sectional view of the second substrate shown in FIG. 3 taken along the line IV-IV and a first substrate disposed thereon according to an exemplary embodiment of the present invention.

Referring to FIG. 3 and FIG. 4, light controllers controlling the transmittance of light through a mechanical operation are formed on a second transparent insulation substrate 210. The light controllers include an opening plate 220 formed on one surface of the second transparent insulation substrate 210, and a light blocker 300 formed on the other surface of the second transparent insulation substrate 210. The opening plate 220 is formed on the outside surface of the second transparent insulation substrate 210, and the light blocker 300 is formed on the surface facing the first transparent insulation substrate 110.

A plurality of first openings 221 are formed in the opening plate 220, and light generated from a light source is transmitted through the first openings 221. An absorption layer for suppressing reflection of external light may be coated on the outside surface of the opening plate 220, and a reflection layer for reflecting the light may be coated on the surface contacting the second transparent insulation substrate 210.

The light blocker 300 includes a light blocking portion 334, electrodes 348, 346, and 336, and a restoring portion 337. The electrodes 348, 346 and 336 move the light blocking portion 334 using an electrical attraction or repulsive force. The restoring portion 337 move the light blocking portion 334 into the original position through an elastic force. The light blocking portion 334 is disposed in the pixel area for displaying the images, and the electrodes 348, 346, and 336 and the restoring portion 337 are disposed corresponding to the region where the gate line 121 and the data line 171 of the first substrate are disposed.

In an exemplary embodiment, the light blocking portion 334 has a plate shape, and includes a plurality of second openings 333 and a blocking portion 332. The second openings 333 may comprise the same shape and size as the first openings 221. The light blocking portion 334 is separated from the second insulation substrate 210 by the distance d2 to move horizontally.

The electrodes 348, 346, and 336 include a first supporter 348 formed on the second insulation substrate 210, a flexible beam 346 connected to the first supporter 348, and a connection beam 336 disposed apart from the flexible beam 346 by a predetermined interval. The first supporter 348 contacts the protrusion electrode 175a. Accordingly, the data voltage signal applied to the protrusion electrode 175a is transmitted to the flexible beam 346 through the first supporter 348. The light blocking portion 334 is separated from the interlayer insulating layer 601 of the first substrate by the distance d1 through the protrusion electrode 175a to move horizontally.

One end of the flexible beam 346 is fixed to the first supporter 348, and the other end of the flexible beam 346 is extended with, for example, a bow shape from the first supporter 348 such that the other end may be freely moved.

One end of the connection beam 336 is connected to the light blocking portion 334, and the other end of the connection beam 336 is fixed to a second supporter 358 disposed on the second insulation substrate 210 such that the light blocking portion 334 is separated from the second insulation substrate 210 by the predetermined interval, thereby being floated. The second supporter 358 is applied with a predetermined voltage.

In an exemplary embodiment, the restoring portion 337 having a spring function has, for example, a cross shape to have elasticity. One end of the restoring portion 337 is connected to the light blocking portion 334. The other end of the restoring portion 337 contacts a third supporter 338. The restoring portion 337 having a function of a spring is manufactured with the cross shape in the present exemplary embodiment, but may be manufactured with shapes of various springs.

The other end of the flexible beam 346 pushes the connection beam 336 by the electrical force of the data voltage transmitted to the flexible beam 346 through the first supporter 348 and the predetermined voltage transmitted to the connection beam 336 through the second supporter 358, such that the light blocking portion 334 connected to the connection beam 336 is horizontally moved. Then, the restoring portion 337 is contracted, thereby having the restoring force. When a voltage difference exists between the flexible beam 346 and the connection beam 336, the light blocking portion 334 returns to its original position by the restoring force of the restoring portion 337.

Accordingly, the light blocking portion 334 is horizontally moved such that the portion of the second opening 333 may be controlled. The position of the second opening 333 of the light blocking portion 334 is aligned to be accorded with the position of the first opening 221 of the opening plate 220 such that the transmittance of light passing through the first opening 221 may be controlled. In the flat panel display according to an exemplary embodiment of the present invention, the light controllers controlling the transmittance of the light by the mechanical operation are manufactured through a micro electro-mechanical system (MEMS) such that the light usage efficiency is higher than in the liquid crystal display that controls the arrangement of liquid crystal. That is, the light incident to the first opening 221 from the light source is not influenced by the light path unlike the liquid crystal display. The light loss by the first insulation substrate 110 and the second insulation substrate 210 comprising a transparent glass, and the influence of interference and diffraction between neighboring pixels may be ignored such that most of the light is vertically incident Accordingly, in exemplary embodiments of the present invention, the light usage efficiency is increased, and thereby the power consumption is reduced.

In a conventional art, a spacer having a thickness of 10 µm must be formed between the substrate including the light blocker 300 and the substrate including the opening plate 220 for preventing an obstacle to the horizontal operation of the light blocker 300, however the thickness of the spacer is thick compared with the fact that it is possible for the column spacer to be formed to a maximum of 5 µm in a manufacturing process of the liquid crystal display in this case, and a large quantity of spacers must be formed to maintain a uniform interval between the substrate formed with the light blocker 300 and the substrate formed with the opening plate 220 such that there is a difficulty in terms of manufacturing process. In an exemplary embodiment, the light blocker 300 and the opening plate 220 are respectively formed on both surfaces of the second transparent insulation substrate 210, and the protrusion electrode 175a is formed on the substrate formed with the thin film transistor such that the space for the horizontal operation of the light blocker 300 by the protrusion electrode 175a is provided. Accordingly, the process for forming the spacer to maintain the interval between the light blocker 300 and the opening plate 220 is omitted, thereby simplifying the manufacturing process.

The light blocker 300 and the opening plate 220 are respectively formed on both surfaces of one second transparent insulation substrate 210 such that the light passing through the light blocker 300 and the light incident to the opening plate 220 progress through the second insulation substrate 210 as the same medium. Accordingly, the progressing path between the light passing through the light blocker 300 and the light incident to the opening plate 220 is not changed, such that an oil injection process to accord the refractive index between different mediums may be omitted, thereby simplifying the manufacturing process.

FIG. 5 to FIG. 8 show a method of forming a second substrate in a flat panel display according to an exemplary embodiment of the present invention. FIG. 9 shows a method of combining a first substrate and a second substrate of a flat panel display according to an exemplary embodiment of the present invention.

Referring to FIG. 1 and FIG. 2, a thin film transistor including the gate electrode 124, the source electrode 173, the drain electrode 175, and the protrusion electrode 175a are formed on a first insulation substrate 110 to form a first substrate.

Figure 5:
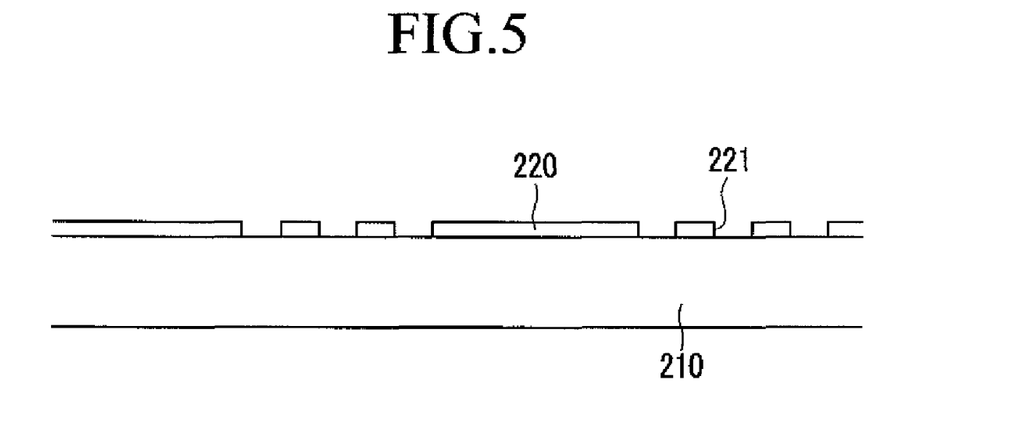
FIG. 5 to FIG. 8 show a method of forming a second substrate in a flat panel display according to an exemplary embodiment of the present invention.

Referring to FIG. 5, an opening plate 220 including a plurality of first openings 221 is formed on one surface of the second transparent insulation substrate 210. The opening plate 220 may be formed by printing the first opening 221 on one surface of the transparent second insulation substrate 210 by using, for example, a printing roller that can be transcribed. A micro-contact printing device including protrusions and depressions with a hydrophilic material formed on the surface thereof contacts one surface of the second transparent insulation substrate 210 to attach the hydrophilic material to the one surface of the second transparent insulation substrate 210. The hydrophilic material is adhered to one surface of the second insulation substrate 210 through a surface treatment such that the opening plate 220 having the first openings 221 may be formed In an exemplary embodiment, a method for forming the opening plate 220 can include disposing a film including the first opening on the second transparent insulation substrate 210.

Figure 6:
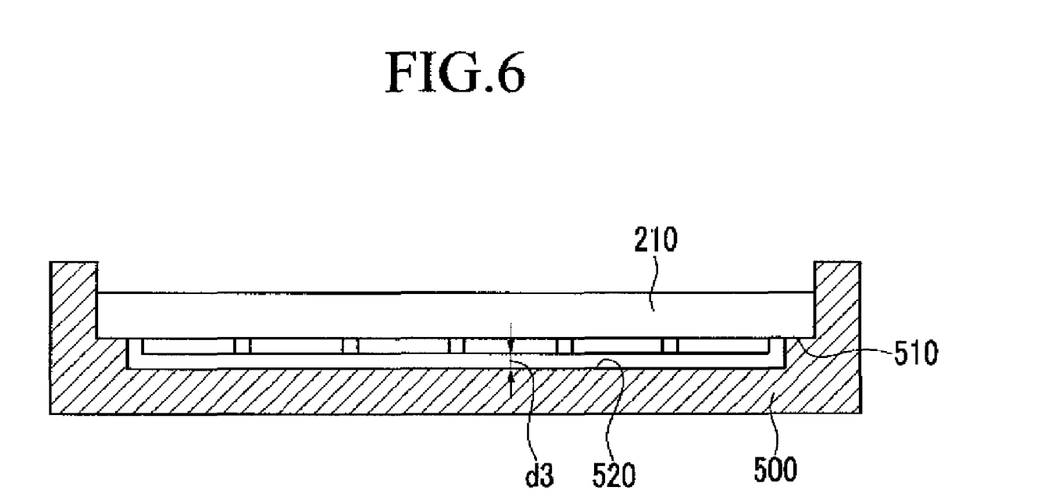

Referring to FIG. 6, the second insulation substrate 210 formed with the opening plate 220 is turned over and is loaded on a stage 500. An edge of the second insulation substrate 210 contacts a supporter 510 that is formed with, for example, a step shape inside the stage 500. Accordingly, the surface of the opening plate 220 is separated from the surface 520 of the stage 500 by the interval d3 such that damage to the opening plate 220 may be prevented when the light blocker 300 is formed on the second transparent insulation substrate 210.

Figure 7:
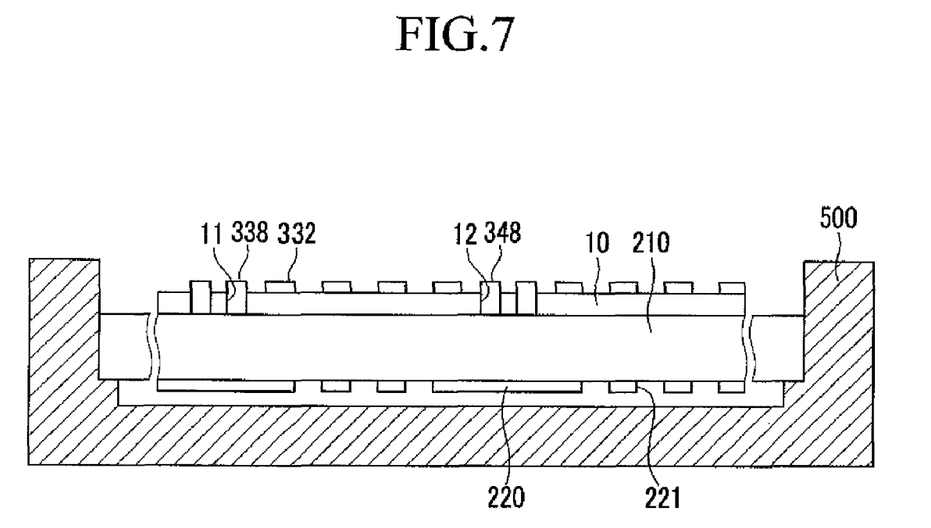

Referring to FIG. 7, a buffer layer 10 is formed on the other surface of the second insulation substrate 210. Supporting holes 11 and 12 to form the first supporter 348 and the third supporter 338 are respectively formed on the buffer layer 10. A supporting hole to form the second supporter 358 is formed. The light blocker 300 comprising metal is formed on the buffer layer 10 and inside the supporting holes 11 and 12. The light blocker 300 includes the light blocking portion 334, electrodes 348, 346, and 336 for providing an elastic force to horizontally move the light blocking portion 334, and the restoring portion 337 for providing a restoring force to restore the light blocking portion 334 to the original position of the light blocking portion 334. The light blocker 300 may be formed, for example, through electrolysis or electroless plating, or through deposition and photolithography of a thin film.

Figure 8:
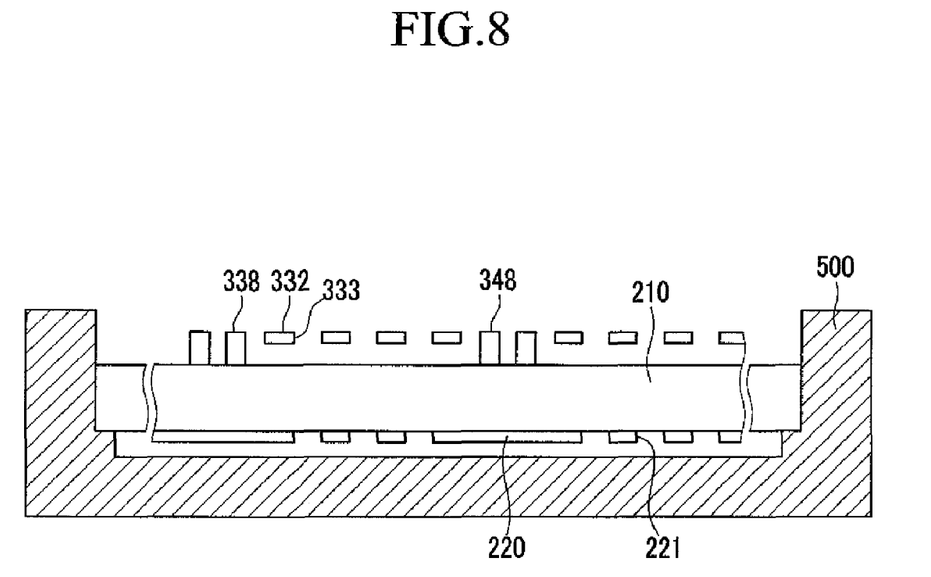
Figure 9:
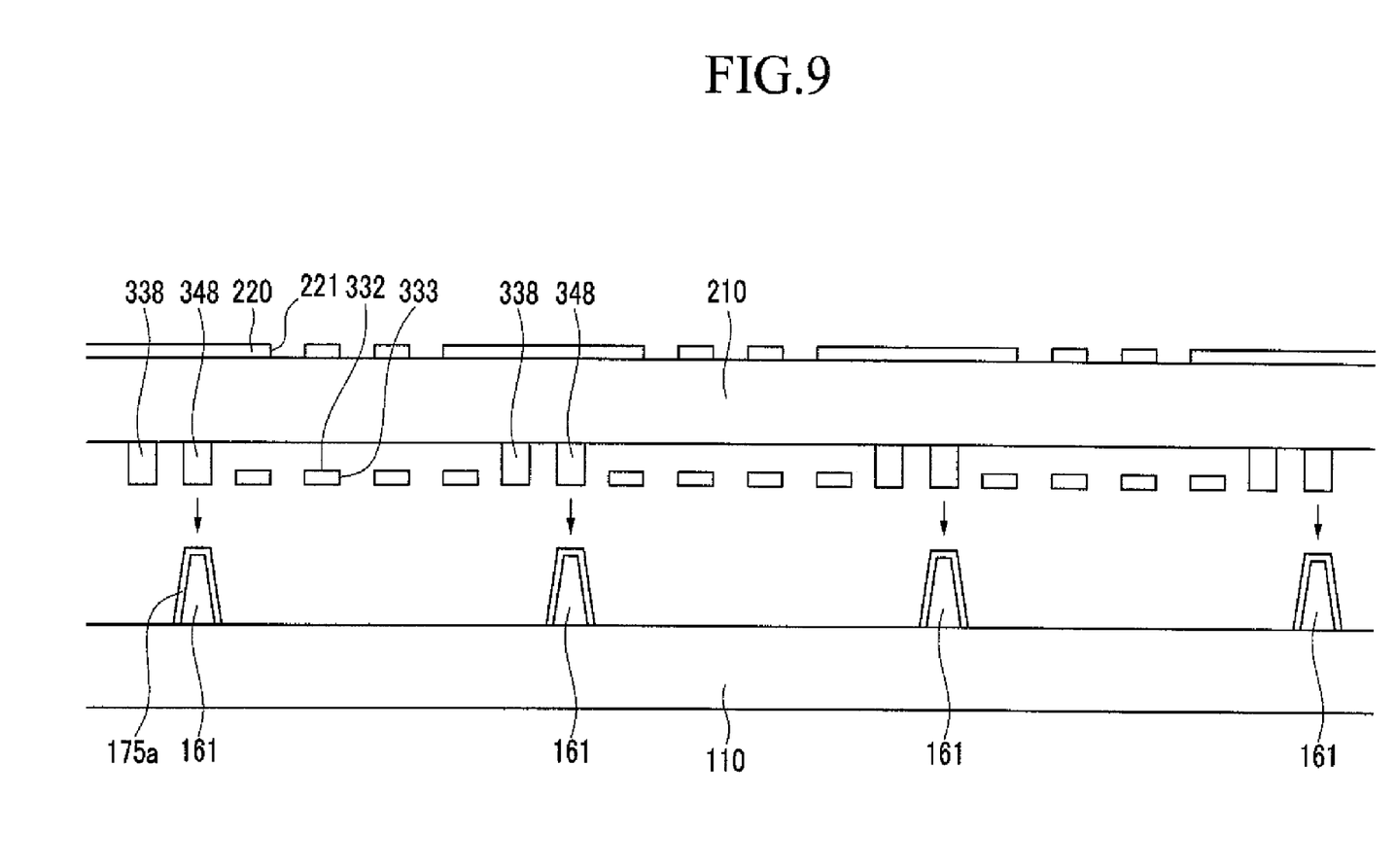
FIG. 9 shows a method of combining a first substrate and a second substrate of a flat panel display according to an exemplary embodiment of the present invention.

Referring to FIG. 8, the buffer 10 is removed through an etching process to form a second substrate in which the light blocking portion 334 is separated from the second transparent insulation substrate 210. Conventionally, the thin film transistor and the light blocker 300 are formed together on one substrate such that the process for forming a thick polymer layer on the thin film transistor is added to separate the thin film transistor and the light blocker 300 from each other and to planarize the surface of the thin film transistor Accordingly, the flat panel display becomes thick, the process is complicated, and the light blocker 300 is poorly manufactured when the planarization is deteriorated.

In an exemplary embodiment, the thin film transistor 124, 171, and 175 and the light blocker 300 are respectively formed on separate substrates such that the planarization process of the substrate formed with the thin film transistor is eliminated to thereby simplify the manufacture process, and a thick polymer layer separating the thin film transistor and the light blocker 300 can be omitted.

Referring to FIG. 9, the first substrate formed with the thin film transistor 124, 171, and 175 and the protrusion electrode 175a, and the second substrate formed with the light blocker 300 and the opening plate 220, are combined. The protrusion electrode 175a contacts the first supporter 348 of the light blocker 300.

Conventionally, there is an overlapping region where the first opening 221 of the opening plate 220 and the second opening 333 of the light blocker 300 are overlapped with each other to smooth an alignment error in the process of attaching the substrate formed with the light blocker 300 and the substrate formed with the opening plate 220. When the overlapping region is increased, the opening region through which the light passes is decreased to thereby deteriorate the light usage efficiency. In an exemplary embodiment, the light blocker 300 and the opening plate 220 are respectively formed on both surfaces of the second transparent insulation substrate 210 such that the alignment between the light blocker 300 and the opening plate 220 is simple, thereby reducing the overlapping region and maximizing the light usage efficiency.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included with the scope of the invention as defined by the appended claims.

What is claimed is:

1. A flat panel display comprising:
a first substrate;
a thin film transistor formed on the first substrate;
a second substrate facing the first substrate; and
a light controller formed on the second substrate, wherein the light controller is electrically connected to the thin film transistor,
wherein the light controller includes an opening plate having a plurality of first openings and a light blocker moving horizontally with respect to the opening plate to selectively pass light through the first openings.

2. The flat panel display of claim 1, wherein the thin film transistor includes a gate electrode, a source electrode, and a drain electrode, and a protrusion electrode connected to the drain electrode.

3. The flat panel display of claim 2, wherein the first substrate further includes a protrusion, and the protrusion electrode is formed on the protrusion.

4. The flat panel display of claim 3, wherein the first substrate and the light blocking portion maintain an interval by the height of the protrusion.

5. The flat panel display of claim 1, wherein the light blocker is formed on an inner surface of the second substrate and between the first substrate and the second substrate.

6. The flat panel display of claim 5, wherein the light blocker includes a light blocking portion having a plurality of second openings and a blocking portion, an electrode providing an electric force to horizontally move the light blocking portion, and a restoring portion providing a restoring force to move the light blocking portion to an original position.

7. The flat panel display of claim 6, wherein the light blocking portion is separated from the second substrate by a predetermined interval.

8. The flat panel display of claim 6, wherein the electrode includes a first supporter formed on the second substrate, a flexible beam connected to the first supporter and curved with a bow shape, and a connection beam separated from the flexible beam by a predetermined interval and connected to the light blocking portion.

9. The flat panel display of claim 8, wherein the first supporter contacts the protrusion electrode.

10. The flat panel display of claim 9, wherein an electric signal of the protrusion electrode is transmitted to the electrode through the first supporter.

11. The flat panel display of claim 10, further comprising a second supporter supporting the second connection beam.

12. The flat panel display of claim 6, wherein a transmittance of light passing through the first openings is controlled by controlling respective positions of the second openings by the movement of the light blocker.

13. The flat panel display of claim 5, wherein the opening plate is formed on an outer surface of the second substrate.

14. A method for manufacturing a flat panel display, comprising:
    forming a thin film transistor on a first substrate;
    forming a protrusion electrode connected to the thin film transistor;
    forming an opening plate having a plurality of first openings on a first surface of a second substrate; and
    forming a light blocker having a first supporter on a second surface of the second substrate.

15. The method of claim 14, further comprising combining the first substrate and the second substrate by contacting the protrusion electrode with the first supporter of the light blocker.

16. The method of claim 15, further comprising forming the light blocker comprises turning over the second substrate and mounting the second substrate on a stage.

17. The method of claim 16, wherein the first surface is separated from a bottom surface of the stage by a predetermined interval.

18. The method of claim 14, wherein the opening plate is formed by using a printing roller.

19. The method of claim 14, wherein the opening plate is formed by a selection printing through a surface treatment.

20. The method of claim 14, wherein forming the light blocker includes:
    forming a buffer layer having a plurality of holes;
    forming the light blocker inside the plurality of holes; and
    removing the buffer layer.

* * * * *